(12) United States Patent
Koyama et al.

(10) Patent No.: US 9,653,379 B2
(45) Date of Patent: May 16, 2017

(54) COOLER AND SEMICONDUCTOR DEVICE HAVING COOLER

(71) Applicant: FUJI ELECTRIC CO., LTD., Kawasaki-shi (JP)

(72) Inventors: Takahiro Koyama, Matsumoto (JP); Noriho Terasawa, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/066,382

(22) Filed: Mar. 10, 2016

(65) Prior Publication Data

US 2016/0190038 A1    Jun. 30, 2016

Related U.S. Application Data

(63) Continuation of application No. PCT/JP2015/052946, filed on Feb. 3, 2015.

(30) Foreign Application Priority Data

Mar. 14, 2014   (JP) ................................. 2014-051037

(51) Int. Cl.
*H01L 23/48*   (2006.01)
*H01L 23/34*   (2006.01)
(Continued)

(52) U.S. Cl.
CPC ............ *H01L 23/473* (2013.01); *F28D 15/00* (2013.01); *F28F 3/02* (2013.01); *F28F 3/022* (2013.01);
(Continued)

(58) Field of Classification Search
CPC ......... H01L 2924/0002; H01L 2924/00; H01L 23/3121; H01L 23/3672; H01L 23/3675;
(Continued)

(56) References Cited

U.S. PATENT DOCUMENTS 6,016,250 A    1/2000   Hanners
6,128,188 A    10/2000  Hanners
(Continued)

FOREIGN PATENT DOCUMENTS

JP    H04-152659 A    5/1992
JP    H04-303954 A    10/1992
(Continued)

OTHER PUBLICATIONS

PCT, "International Search Report for International Application No. PCT/JP2015/052946".
(Continued)

*Primary Examiner* — Teresa M Arroyo
(74) *Attorney, Agent, or Firm* — Manabu Kanesaka (57) ABSTRACT

A cooler for cooling a semiconductor module includes a top plate; a jacket having a side plate and a bottom plate and firmly fixed to the top plate; a refrigerant inflow port through which a refrigerant flows into a space surrounded by the top plate and jacket; a refrigerant outflow port through which the refrigerant flows out from the space; a plurality of fins firmly fixed to the top plate and disposed separately on each of the left and right relative to a main refrigerant path in the jacket to be inclined toward the inflow side of the main refrigerant path; heat transfer pins disposed on the top plate on the refrigerant inflow sides of the fins; and a curved plate-like bimetal valve having one end connected to each respective heat transfer pin and another free end.

11 Claims, 6 Drawing Sheets

300

(51) Int. Cl.
    *F28F 7/00*     (2006.01)
    *F28D 15/00*     (2006.01)
    *F28F 27/00*     (2006.01)
    *H01L 23/473*     (2006.01)
    *H01L 23/367*     (2006.01)
    *H05K 7/20*     (2006.01)
    *F28F 3/02*     (2006.01)
    *F28F 3/12*     (2006.01)
    *F28F 3/04*     (2006.01)
    *F28F 27/02*     (2006.01)
    *F28F 13/12*     (2006.01)
    *H01L 23/31*     (2006.01)
    *H01L 23/498*     (2006.01)
    *H01L 25/065*     (2006.01)
    *H01L 23/373*     (2006.01)

(52) U.S. Cl.
    CPC ............... *F28F 3/048* (2013.01); *F28F 3/12* (2013.01); *F28F 13/12* (2013.01); *F28F 27/02* (2013.01); *H01L 23/3121* (2013.01); *H01L 23/3672* (2013.01); *H01L 23/3675* (2013.01); *H01L 23/3677* (2013.01); *H01L 23/3736* (2013.01); *H01L 23/49838* (2013.01); *H01L 25/0655* (2013.01); *H05K 7/20927* (2013.01); *F28F 2255/04* (2013.01); *H01L 23/3735* (2013.01); *H01L 2924/0002* (2013.01)

(58) Field of Classification Search
    CPC ............. H01L 23/3677; H01L 23/3735; H01L 23/3736; H01L 23/473; H01L 23/49838; H01L 25/0655; F28D 15/00; F28F 13/12; F28F 2255/04; F28F 27/02; F28F 3/02; F28F 3/022; F28F 3/048; F28F 3/12; H05K 7/20927
    USPC .......... 257/693, 714; 165/80.4, 80.5, 104.19, 165/104.22, 274, DIG. 37, DIG. 92, 165/DIG. 125, DIG. 129
    See application file for complete search history.

(56) References Cited

U.S. PATENT DOCUMENTS

| | | | |
|---|---|---|---|
| 8,933,557 B2 * | 1/2015 | Gohara | H01L 23/3735 165/168 |
| 2007/0289728 A1 * | 12/2007 | Itoh | F28D 1/05366 165/177 |
| 2009/0056350 A1 | 3/2009 | Germann et al. | |
| 2013/0206371 A1 * | 8/2013 | Fujita | H01L 23/473 165/104.28 |
| 2016/0322278 A1 * | 11/2016 | Sawagashira | H01L 23/40 |

FOREIGN PATENT DOCUMENTS

| | | | |
|---|---|---|---|
| JP | 2007-333357 A | | 12/2007 |
| JP | 2011-54778 A | | 3/2011 |
| JP | 2011-144900 A | | 7/2011 |
| JP | 2013-002735 A | | 1/2013 |
| JP | 2013-16590 A | | 1/2013 |
| JP | 2013016590 A | * | 1/2013 |
| JP | 2013-26434 A | | 2/2013 |

OTHER PUBLICATIONS

Europe Patent Office, "Search Report for European Patent Application No. 15760988.4," Feb. 10, 2017.

* cited by examiner

COOLER AND SEMICONDUCTOR DEVICE HAVING COOLER

CROSS-REFERENCE TO RELATED APPLICATION

This is a continuation application of PCT/JP2015/052946 filed on Feb. 3, 2015, which claims priority of Japanese Patent Application No 2014-051037 filed on Mar. 14, 2014, the disclosure of which is incorporated herein as a reference.

TECHNICAL FIELD

The present invention relates to a cooler, which cools a semiconductor module, and a semiconductor device having the cooler.

BACKGROUND ART

Heretofore, a semiconductor module and a cooler thereof are formed in the following way.

Figure 5A:
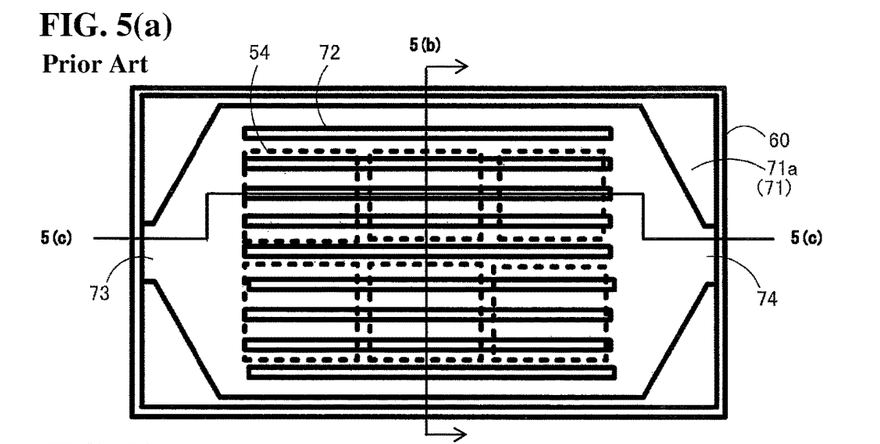
FIGS. 5(a)-5(c) are diagrams wherein a heretofore known semiconductor module is mounted on a cooler.
Figure 5B:
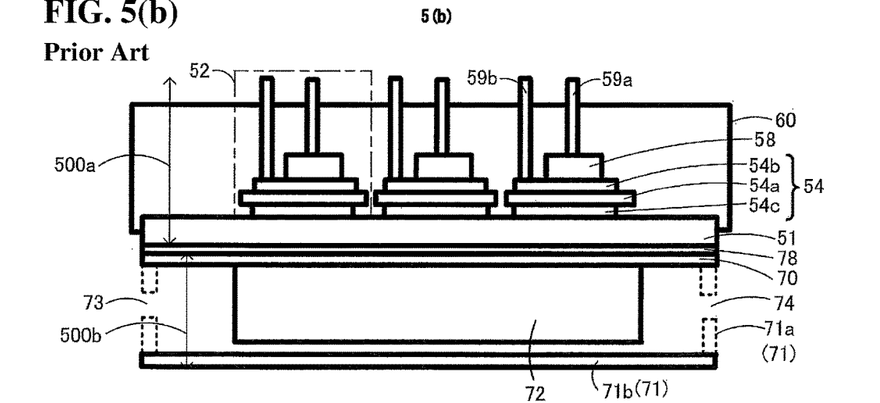
Figure 5C:
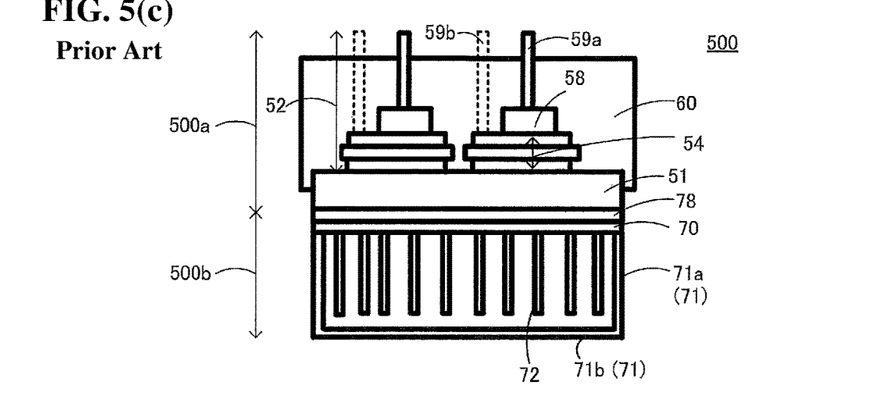

FIGS. 5(a)-5(c) are diagrams with a heretofore known semiconductor module 500a mounted on a cooler 500b, wherein FIG. 5(a) shows a main portion plan view, viewed through a bottom plate of the cooler from the rear, FIG. 5(b) shows a main portion sectional view taken along line 5(b)-5(b) in FIG. 5(a), and FIG. 5(c) shows a main portion sectional view taken along the line 5(c)-5(c) in FIG. 5(a).

The semiconductor module 500a includes a metal base 51, six circuit substrates 54 each having an insulating substrate 54a, a circuit portion 54b on the front surface of the insulating substrate 54a, and a metal portion 54c on the rear surface of the insulating substrate 54a, and a plurality of semiconductor chips 58, each being firmly fixed to each circuit portion 54b. The semiconductor module 500a includes first external terminals 59a each being connected to each semiconductor chip 58, second external terminals 59b each being connected to each circuit portion 54b, and a resin portion 60 sealing the whole with the rear surface of the metal base 51, leading end portions of the first external terminals 59a, and leading end portions of the second external terminals 59c being exposed. One wherein the circuit substrate 54, to which the semiconductor chip 58 is firmly fixed, the first external terminal 59a, and the second external terminal 59b are assembled by a joining material, such as a solder, is called an intermediate assembly 52. Herein, a case in which six intermediate assemblies 52 are mounted is shown. Normally, each of the intermediate assemblies 52 includes, for example, an IGBT (insulated gate bipolar transistor) chip and an FWD (free wheeling diode) chip connected in inverse parallel thereto.

The cooler 500b includes a top plate 70, a jacket 71 fixed to the top plate 70, and fins 72, disposed in the jacket 71, which are disposed parallel to the stream of cooling water and firmly fixed to the top plate 70. The jacket 71 is an open-topped casing having a side plate 71a and bottom plate 71b, and a refrigerant inflow port 73 and a refrigerant outflow port 74 are provided in the side plate 71a. The fins 72 are disposed uniformly in parallel in the jacket 71, and the fins 72 have a flat shape. Each intermediate assembly 52 is cooled by flowing a refrigerant between adjacent fins 72.

A semiconductor device 500 is formed of the semiconductor module 500a and the cooler 500b, wherein for example, a thermal compound 78 is applied to the metal base 51 of the semiconductor module 500a, and the semiconductor module 500a is fixed to the cooler 500b by bolts, bands, or the like.

Herein, the cooling of the semiconductor module 500a on which is mounted the plurality of semiconductor chips 58 is carried out by one cooler 500b, and the control of the cooling capacity of the cooler 500b is carried out by adjusting the flow rate of the refrigerant.

For example, PTL 1 describes a heat sink wherein cooling fins having a bimetal structure, with two metals of each fin warping in opposite directions to each other depending on temperature, increase surface area, thus improving the cooling capacity.

Also, PTL 2 describes a cooing device wherein heat is transferred to a bimetal from an uncooled body by a heat pipe, and a flap is formed by a change in shape of the bimetal, thus changing the volume of cooling air.

Also, PTL 3 describes a semiconductor device cooling device which transfers heat generated from each semiconductor chip of a multichip module with a substrate to which a plurality of semiconductor chips is firmly fixed, to a cooling jacket provided opposite the module, and thus collectively cooling the semiconductor chips for each module, wherein the temperatures of the semiconductor chips on the substrate are individually detected, and the coolings of the semiconductor chips are individually controlled based on the detected temperatures.

CITATION LIST

Patent Literature

PTL 1: JP-A-4-303954
PTL 2: JP-A-2011-144900
PTL 3: JP-A-4-152659

SUMMARY OF INVENTION

Technical Problem

Figure 6:
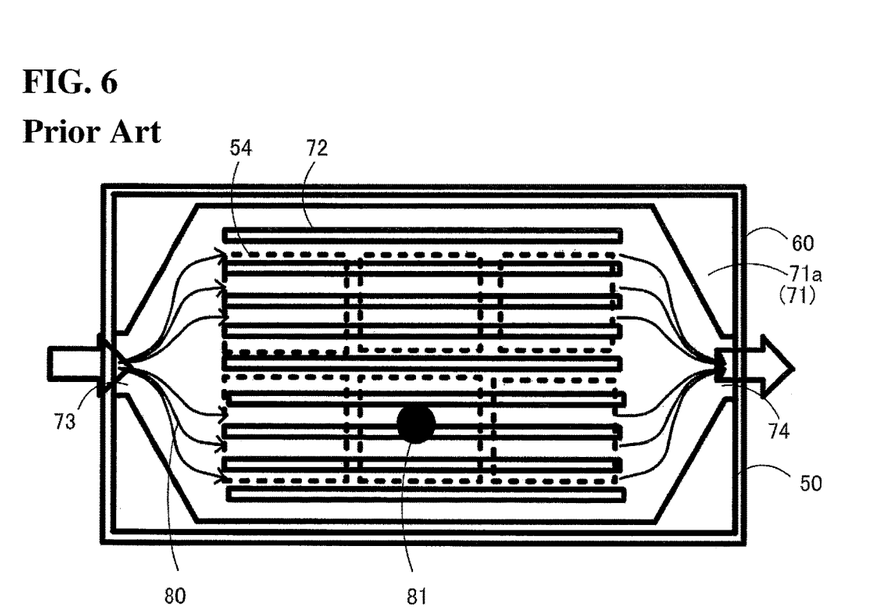
FIG. 6 is a diagram showing a place high in temperature in the known cooler of FIG. 5.

With the semiconductor device 500 shown in FIGS. 5(a)-5(c), a temperature distribution is sometimes formed in the principal surface due to the difference in the individual characteristics and operating condition between the plurality of mounted semiconductor chips 58. For example, FIG. 6 shows a place 81 which reaches a high temperature when the semiconductor chip 58 operates. The insulating substrate 54 immediately below the semiconductor chip 58 high in temperature also reaches a high temperature at the place 81. Supposing that stream 80 is flowing uniformly between the fins 72 and has no difference in cooling capacity, the temperature of the stream 80 sometimes rises 20° C. to 30° C. at the place 81 compared with at the other places.

Also, when there is a difference in temperature between the semiconductor chips 58, the performance of the semiconductor device 500 is determined by the maximum operating temperature of the semiconductor chip 58 which reaches a highest temperature.

Also, when there is a temperature distribution in the semiconductor device 500, there is the possibility that a difference in heat expansion occurs between the members of the intermediate assembly 52, and the members change in shape, thus impairing reliability.

The PTLs propose various measures, but not sufficiently. For example, it is not described in PTL 1 that bimetal valves are mounted to the cooler. It is not described in PTL 2 that the cooling capacity is enhanced by increasing the amount of cooling medium at the place high in temperature in the cooler. In PTL 3, the refrigerant hits perpendicularly toward the rear surface side of the semiconductor chips, and it is not described that a cooling medium (water) is circulated in a horizontal direction.

An object of the invention is to solve the problems and provide a cooler, having a small number of parts and a simple structure, which can automatically enhance cooling capacity when at high temperature, and a semiconductor device which is easy to assemble.

Solution to Problem

In order to achieve the object, a cooler of the invention cools a semiconductor module, and includes a top plate; a jacket, having a side plate and a bottom plate, the side plate of which is firmly fixed to the top plate; a refrigerant inflow port through which a refrigerant flows into a space surrounded by the top plate and the jacket; a refrigerant outflow port through which the refrigerant flows out from the space; a plurality of fins firmly fixed to the top plate, and disposed separately on each of the left and right of a main refrigerant path in the jacket to be inclined toward the inflow side of the main refrigerant path; heat transfer pins disposed in positions on the top plate on the refrigerant inflow sides of the fins; and a curved plate-like bimetal valve, one end of which is connected to each heat transfer pin, and the other end of which is a free end.

According to the cooler of the invention, the flow rate of the refrigerant is automatically increased by the bimetal valves when a semiconductor chip reaches a high temperature, and it is thus possible to suppress arise in temperature of the semiconductor chip. Also, as the cooler has a small number of parts and a simple structure, it is easy to assemble the cooler.

Also, in the cooler of the invention, it is desirable that the inclination angle of the fins is in a range of 30 degrees or more and 60 degrees or less with the main refrigerant path as a reference.

According to this kind of structure, it is possible to effectively take in the stream of the refrigerant flowing between the fins from the main refrigerant path.

Also, in the cooler of the invention, it is desirable that the refrigerant is a liquid.

According to this kind of structure, as the specific heat of the refrigerant is high compared with a gas, it is possible to enhance cooling capacity.

Also, in the cooler of the invention, it is desirable to include a blocking plate on the downstream side of the main refrigerant path and before the refrigerant outflow port.

According to this kind of structure, as pressure loss increases compared with when the refrigerant flows from the main refrigerant path directly to the refrigerant outflow port, it is possible to increase the flow rate of the refrigerant flowing between the fins on the upstream side of the blocking plate. Then, it is possible to enhance the cooling capacity of the cooler.

Also, in the cooler of the invention, it is desirable that the installation distance between adjacent heat transfer pins is twice or more as large as the distance between adjacent fins.

According to this kind of structure, it is possible to prevent the mutual interference between the bimetal valves.

Also, in the cooler of the invention, it is desirable that the bimetal valve can change to a first shape, which is curved in a refrigerant inflow direction, and to a second shape which becomes closer to linear as the temperature becomes higher than that in the first shape, and that in the first shape, the distance between the free end of the bimetal valve and the fin adjacent thereto is equal to the distance between adjacent fins.

According to this kind of structure, it is possible to take in more of the refrigerant in the second shape than in the first shape. Then, the bimetal valve in a portion exposed to a high temperature changes to the second shape, thus enabling an increase in the amount of refrigerant taking in.

Also, in the cooler of the invention, it is desirable that the bimetal valve has a first metal piece and a second metal piece joined together. The second metal piece is higher in expansion coefficient than the first metal piece. The first metal piece is an iron-nickel alloy plate, and the second metal piece is formed such that one or a plurality of metals selected from the group consisting of manganese, chromium, and copper are added to an iron-nickel alloy plate.

According to this kind of structure, it is possible to obtain a bimetal valve including the first shape and second shape.

In the cooler of the invention, it is desirable that the thickness of the bimetal valve is 0.5 mm or more and 5 mm or less.

According to this kind of structure, it is possible to obtain a bimetal valve including a desired amount of change in shape.

Also, a semiconductor device of the invention includes any one of the heretofore described coolers, a circuit substrate having an insulating substrate, a circuit portion on the upper surface of the insulating substrate, and a metal portion on the lower surface of the insulating substrate; a semiconductor chip, electrically connected to the circuit portion, which is cooled by the cooler; a first external terminal connected to the semiconductor chip; a second external terminal connected to the circuit portion; and a resin portion which houses the circuit substrate, the semiconductor chip, the first external terminal, and the second external terminal, except the surface on the opposite side of the metal portion from the insulating substrate, one end of the first external terminal, and one end of the second external terminal, wherein the plurality of fins is thermally connected to the metal portion, and the heat transfer pins are disposed below the insulating substrate.

According to this kind of structure, the bimetal valve below the semiconductor chip exposed to a high temperature changes in shape due to heat, and the amount of refrigerant taken in increases. Then, the semiconductor chip thereabove is effectively cooled.

Also, in one aspect of the semiconductor device of the invention, the heretofore described semiconductor device includes a plurality of intermediate assemblies each having the circuit substrate, the semiconductor chip, the first external terminal, and the second external terminal; a metal base disposed between a plurality of the metal portions and the top plate; a first connection member which thermally connects the plurality of metal portions and the metal base; and a second connection member which thermally connects the metal base and top plate.

According to this kind of structure, as the metal base is disposed between the metal portions and the top plate, it is possible to suppress a change in shape occurring due to the difference in heat expansion coefficient between the members with respect to a cooling/heating cycle occurring with an actuation and stop of the semiconductor device, and thus possible to strengthen the rigidity of the cooler.

Also, in another aspect of the semiconductor device of the invention, in the heretofore described semiconductor device, the top plate is the metal portion.

According to this kind of structure, as the heat transfer path from the semiconductor chips to the fins is short, it is possible to increase the heat transfer rate. Further, it is possible to enhance the cooling capacity of the cooler.

Advantageous Effects of Invention

According to the cooler of the invention, when the semiconductor chip reaches a high temperature, the flow rate of the refrigerant is automatically increased by the bimetal valve, and it is thus possible to suppress a rise in the temperature of the semiconductor chip. Also, as the cooler has a small number of parts and a simple structure, it is easy to assemble the cooler.

DESCRIPTION OF EMBODIMENTS

A description will be given, using the drawings, of an embodiment of the invention. The invention, not being limited to the following working examples, can be implemented appropriately modified without departing from the scope of the invention.

Working Example 1

Figure 1A:
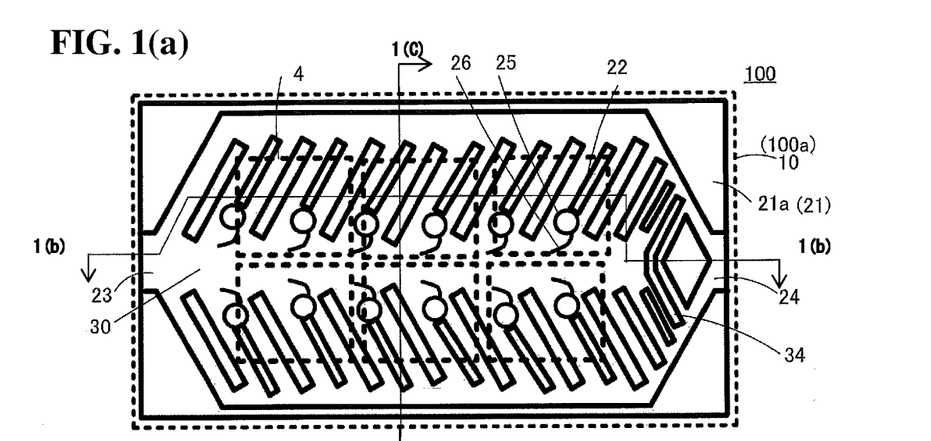
FIGS. 1(a)-1(c) are diagrams of a cooler of a first working example according to the invention.
Figure 1B:
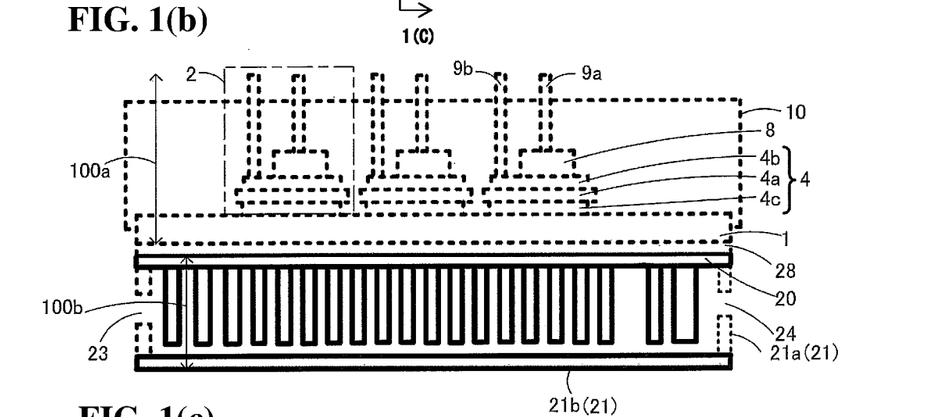
Figure 1C:
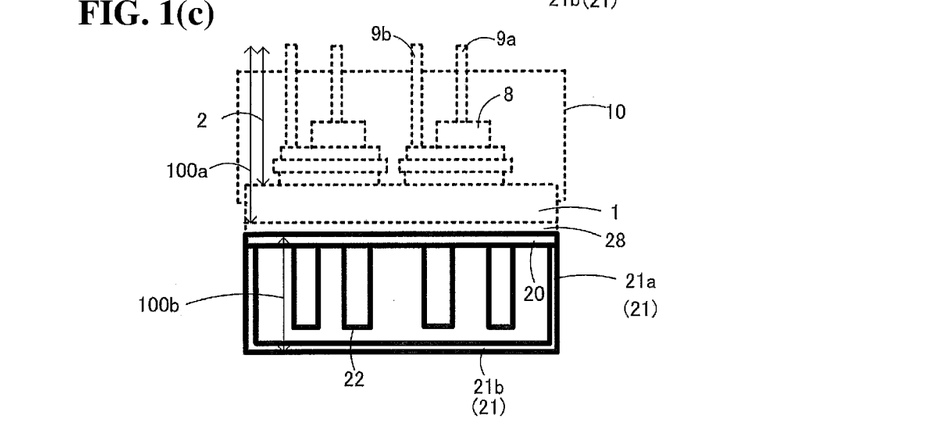

FIGS. 1(a)-1(c) show one of embodiments according to a cooler of the invention. FIG. 1(a) is a main portion plan view, viewed through a bottom plate 21b of a jacket 21 from the rear, FIG. 1(b) is a main portion sectional view taken along line 1 (b)-1 (b) in FIGS. 1(a), and FIG. 1(c) is a main portion sectional view taken along the line 1(c)-1(c) in FIG. 1(a). The cooler 100b is used to cool a semiconductor module 100a or the like. The semiconductor module 100a is fixed to the cooler 100b via a thermal compound 28.

The semiconductor module 100a includes circuit substrates 4 each having an insulating substrate 4a, a circuit portion 4b on the upper surface of the insulating substrate, and a metal portion 4c on the lower surface of the insulating substrate 4a, semiconductor chips 8, each electrically connected to the circuit portion 4b, which is cooled by the cooler 100b, first external terminals 9a each being connected to the semiconductor chip 8, second external terminals 9b each being connected to the circuit portion, and a resin portion 10 which houses the circuit substrates 4, the semiconductor chips 8, the first external terminals 9a, and the second external terminals 9b, except the surfaces on the opposite sides of the metal portions 4c from the insulating substrates 4a, one end of each of the first external terminals 9a, and one end of each of the second external terminals 9b. A plurality of fins 22 of the cooler 100b is fixed to the rear surface of the top plate 20, and is thermally connected to the semiconductor chips 8 byway of the top plate 20, the thermal compound 28, a metal base 1, the metal portion 4c, the insulating substrate 4a, and the circuit portion 4b. Heat transfer pins 25 are disposed on the rear surface of the top plate 20 which is located below the insulating substrates 4a. Furthermore, a semiconductor device 100 of the invention includes a plurality of intermediate assemblies 2 each having the circuit substrate 4, the semiconductor chip 8, the first external terminal 9a, and the second external terminal 9b, and includes the metal base 1 disposed between a plurality of the metal portions 4c and the top plate 20, a first connection member (not shown) which thermally connects the plurality of metal portions 4c and the metal base 1, and a second connection member (not shown) which thermally connects the metal base 1 and top plate 20.

The plurality (in FIG. 1, six) of intermediate assemblies 2 is mounted on the cooler 100b via the thermal compound 28 or the like.

The cooler 100b of the invention is a liquid cooling type cooler which cools the semiconductor module 100a, and as a refrigerant, without being particularly limited, a liquid, such as water or an ethylene glycol solution, can be used. More specifically, the cooler 100b includes the top plate 20, the jacket 21, having a side plate 21a and the bottom plate 21b, the side plate 21a of which is firmly fixed to the top plate 20, a refrigerant inflow port 23 through which the refrigerant flows into a space surrounded by the top plate 20 and the jacket 21, a refrigerant outflow port 24 through which the refrigerant flows out from the space, the plurality of fins 22, firmly fixed to the top plate 20 and disposed separately on each of the left and right of a central main refrigerant path 30 in the jacket 21 which extend to the refrigerant inflow port 23, and which are disposed to incline toward the inflow side of the main refrigerant path 30, the heat transfer pins 25 disposed in positions on the rear surface of the top plate 20 on the refrigerant inflow sides of the fins 22, and a curved plate-like bimetal valve 26, one end of which is connected to each respective heat transfer pin 25, and the other end of which is a free end.

As the jacket 21 is fabricated by, for example, forming a thick flat plate into a top open casing by cutting or pressing, the side plate 21a and the bottom plate 21b may be integrated.

The places to install the refrigerant inflow port 23 and the refrigerant outflow port 24 are not limited to the side plate 21a. For example, the refrigerant inflow port 23 and the refrigerant outflow port 24 may be provided in the bottom plate 21b.

Also, the cooler 100b includes a blocking plate 34 on the downstream side of the main refrigerant path in the center of the jacket 21, which extends from the refrigerant inflow port 23, and before the refrigerant outflow port 20. It is not preferable to provide no blocking plate 34 because as the refrigerant flowing through the main refrigerant path 30 flows directly to the refrigerant outflow port 24, the flow rate of the refrigerant flowing between the fins 22 is likely to decrease.

It is preferable that the installation distance between the heat transfer pins 25 is twice or more as large as the distance between adjacent fins 22, and in FIGS. 1(a)-1(c), the heat transfer pins 25 and bimetal valves 26 are disposed, each skipping one fin 22. It is not effective that the bimetal valves are disposed one on each consecutive fin because the amount of refrigerant taken in by the downstream side bimetal valves decreases. According to this kind of configuration, it is possible to prevent the mutual interference between the bimetal valves.

The bimetal valves 26 can change to a first shape which is curved in a refrigerant inflow direction, and to a second shape which becomes closer to linear as the temperature becomes higher than that in the first shape, and the bimetal valves 26 are formed so that the distance between the free end of each bimetal valve 26 and the fin 22 adjacent thereto is equal to the distance between adjacent fins 22, and are disposed so as not to make contact with the bottom plate 21b of the jacket 21 or the top plate 20 when in the first shape. The bimetal valves 26 curved at room temperature behave so as to become closer to linear with a rise in temperature. The bimetal valves 26, by becoming closer to linear, function to block one portion of the main refrigerant path 30 and change the stream direction so that the stream in the main refrigerant path 30 flows to the fin 22 side.

The bimetal valves 26 are formed such that a first metal piece and a second metal piece higher in expansion coefficient than the first metal piece are joined. As the low expansion coefficient side first metal piece, an iron-nickel alloy plate (Invar (trademark) or the like) is used, and as the high expansion coefficient side second metal piece, a plate wherein one or a plurality of metals selected from the group consisting of manganese, chromium, and copper is added to an iron-nickel alloy plate, is used. The bimetal valves 26 are formed by bonding the first metal piece and the second metal piece by cold rolling. As the thickness (the combined thickness of the first and second metal pieces) of the bimetal valves 26, a thickness with the strength which can withstand the stream flowing inside the cooler 100b is selected, and it is preferred that the thickness is in a range of 0.5 mm or more and 5 mm or less. When the thickness is less than 0.5 mm, the mechanical strength is small, thus leading to the possibility of a change in shape due to the stream. More than 5 mm is not preferable because the heat capacity increases, and the rise in temperature of the bimetal valves 26 is delayed, thus leading to a decrease in temperature followability.

Figure 2A:
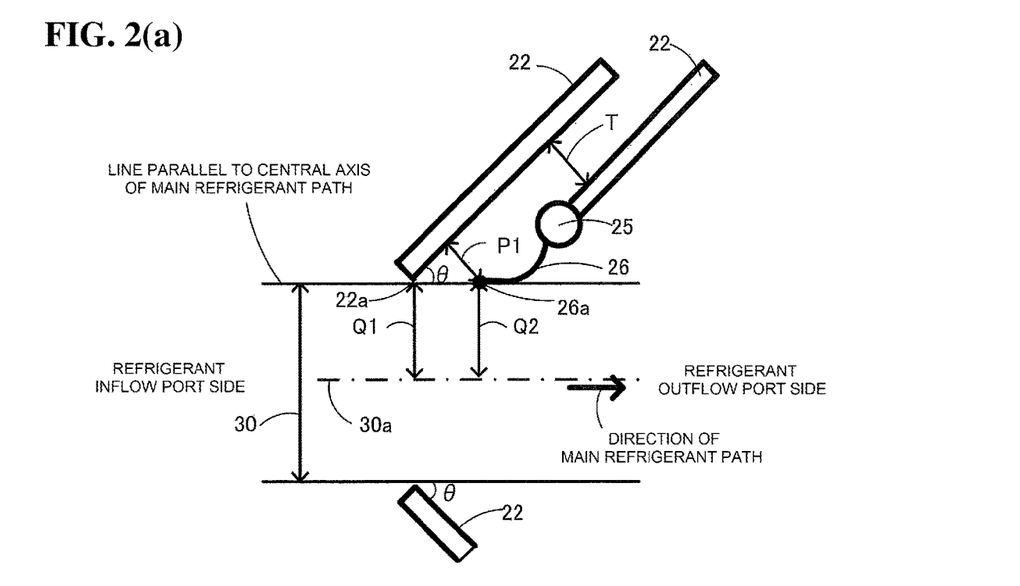
FIGS. 2(a) and 2(b) show illustrations illustrating curved states of a bimetal valve in a first shape and a second shape.
Figure 2B:
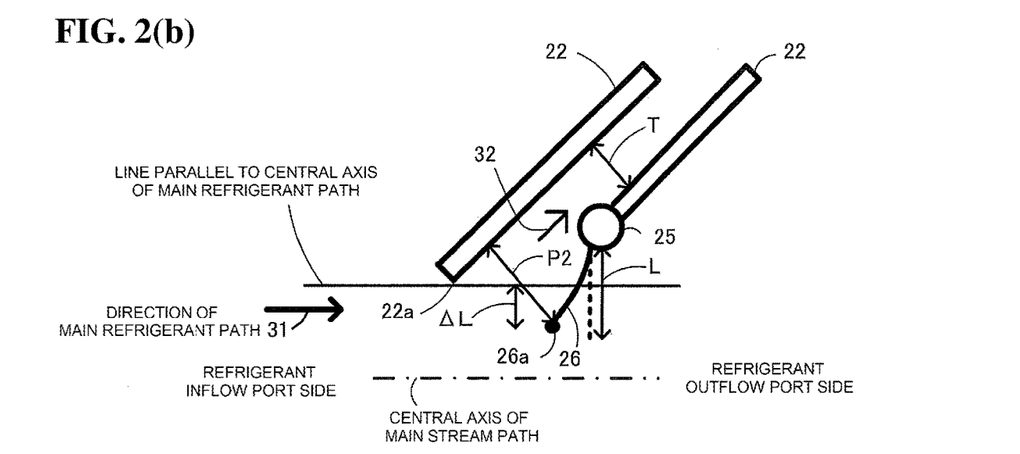

FIGS. 2(a) and 2(b) show illustrations illustrating curved states of the bimetal valve 26 in the first shape and the second shape. FIG. 2(a) is a diagram in the first shape, and FIG. 2(b) is a diagram in the second shape.

One heat transfer pin 25 is disposed on the upstream side of every two fins 22. By so doing, it is possible to increase the mounting density of the bimetal valves 26, and thus possible to reliably dispose the bimetal valves 26 below the semiconductor chip 8. Also, when the fins 22 are narrowly spaced, one heat transfer pin 25 may be installed on every three or more fins 22. That is, it is important that one or more bimetal valves 26 are disposed immediately below the intermediate assembly 2 regardless of the size of the intermediate assembly 2.

Also, an inclination angel θ of the fin 22 is set in a range of 30 degrees or more and 60 degrees or less with a central axis 30a of the main refrigerant path 30 as a reference. By so doing, a constant amount of a refrigerant 32, which branches from a refrigerant 31 flowing through the main refrigerant path 30 and flows between the fins 22, flows stably and uniformly between the fins 22, as shown in FIGS. 2(a), 2(b) to be described hereafter.

The bimetal valve 26, one end of which is fixed to the heat transfer pin 25, is curved concavely toward the refrigerant inflow port 23 side when in the first shape formed at low temperature. The concavely curved bimetal valve 26, when at high temperature, changes in shape so as to become closer to linear and forms the second shape, as shown in FIG. 2(b). Therefore, a leading end portion 26a acts to block one portion of the refrigerant 31 flowing through the main refrigerant path 30 and change the direction of the refrigerant 31 so that the refrigerant 31 flows to the fin 22 side. Therefore, when at high temperature, the flow rate of the refrigerant 32 flowing to the fin 22 side increases, thus efficiently cooling the circuit substrate 4 immediately above. The semiconductor chip 8 is cooled via the cooled circuit substrate 4.

Also, as the material of the top plate 20 and fins 22, without being particularly limited, for example, a material with good heat conduction, such as aluminum, is preferable. As the heat transfer rate of the cooler when starting the semiconductor device can be improved by reducing the thickness of the top plate, it is possible to mount a higher power semiconductor chip. Further, it is possible to lower the weight of the cooler, and thus possible to reduce manufacturing cost. However, as the mechanical strength decreases when the thickness of the top plate 20 is less than 1 mm, it is preferable to set the thickness of the top plate 20 to 1 mm or more.

Meanwhile, by increasing the thickness of the top plate 20, heat generated in the semiconductor chip 8 transfers to the fins 22 in a wider range of the cooler 100b, and the area of the fins 22 in contact with the refrigerant increases, meaning that it is possible to enhance the cooling capacity when steadily operating the semiconductor device. However, as the transient response performance of the cooler 100b decreases when the thickness of the top plate 20 is too large, there is the disadvantage that it is difficult to mount a high power semiconductor chip. Therefore, it is preferable that the thickness of the top plate 20 is 3 mm or less.

In light of the heretofore described, the thickness of the top plate 20 is preferably set to 1 mm or more and 3 mm or less, and more preferably, to 1 mm or more and 2 mm or less.

According to the heretofore described aspect, the heat of the semiconductor chip 8 which is being generated is transferred via the heat transfer pins 25 to the fins 22 disposed in the cooler 100b. The heat transfers to the bimetal valve 26, the curved bimetal valve 26 becomes closer to linear, and the free end side of the bimetal valve 26 moves into the main refrigerant path 30. Then, one portion of the refrigerant stream flowing through the main refrigerant path 30 can be led between the fins 22. As a result of this, the flow rate of the refrigerant flowing to the fin 22 side from the main refrigerant path 30 increases, thus promoting the cooling of the intermediate assembly 2 and cooling the semiconductor chip 8.

As heretofore described, by installing the bimetal valves 26 on the fins 22 and adjusting the cooling capacity, it is possible to prevent a rise in temperature of the semiconductor chip 8 and equalize the temperature distribution of the intermediate assemblies 2. By the portions of the intermediate assemblies 2 being uniformly cooled, it is possible to improve the output (current capacity) of the semiconductor module 100a.

Also, as the portions of six intermediate assemblies 2 forming the semiconductor module 100a are uniform in temperature, it is possible to reduce a change in the shape of each member due to heat expansion, and thus possible to improve the reliability of the semiconductor module 100a.

Herein, a more detailed description will be given of the bimetal valve 26. When the bimetal valve 26 is in a low temperature state (FIG. 2 (a)), it is preferable that a minimum distance P1 (the distance in a direction perpendicular to the surfaces of the fins 22) between the free end 26a of the bimetal valve 26 and the fin 22 adjacent to the inflow port side of the main refrigerant path 30 is approximately once with reference to a minimum distance T between the adjacent fins 22. Also, it is desirable that a minimum distance Q2 (the distance in a direction perpendicular to the central axis) between the free end 26a of the bimetal valve 26 and the central axis 30a of the main refrigerant path 30 is substantially equal to a minimum distance Q1 (the distance in the direction perpendicular to the central axis) between a leading end portion 22a of the fin 22 adjacent to the refrigerant inflow port side and the central axis 30a of the main refrigerant path 30. That is, it is preferable that the straight line connecting the leading end portion 22a of the fin 22 and the free end 26a of the bimetal valve 26 is substantially parallel to the central axis 30a.

When the bimetal valve 26 is in a high temperature state (FIG. 2(b)), the bimetal valve 26 comes closer to linear, and the free end 26a of the bimetal valve 26 sticks out, by an amount of sticking out ΔL, into the main refrigerant path 30. Then, one portion of the refrigerant stream in the main refrigerant path 30 is taken into the fin 22 side, and the flow rate of refrigerant on the side of the fin 22, on the upstream side of which the bimetal valve 26 is provided, is increased. As a result of this, the capacity to cool the intermediate assembly 2 is improved, and the semiconductor chip 8 is cooled.

According to Working Example 1, by providing the bimetal valves 26 in the cooler 100b, it is possible to reduce the number of parts compared with PTL 2 and PTL 3, thus enabling a simple configuration.

Working Example 2

Figure 3A:
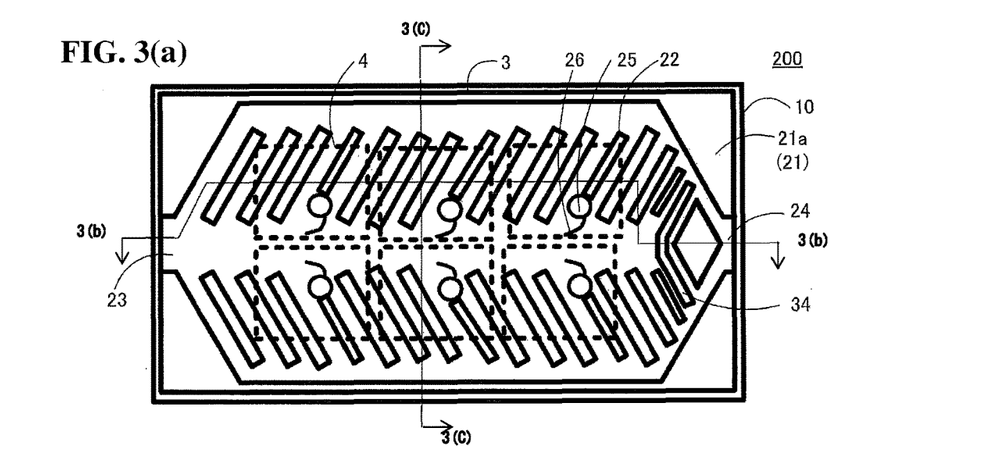
FIGS. 3(a)-3(c) are diagrams of a semiconductor device of a second working example according to the invention.
Figure 3B:
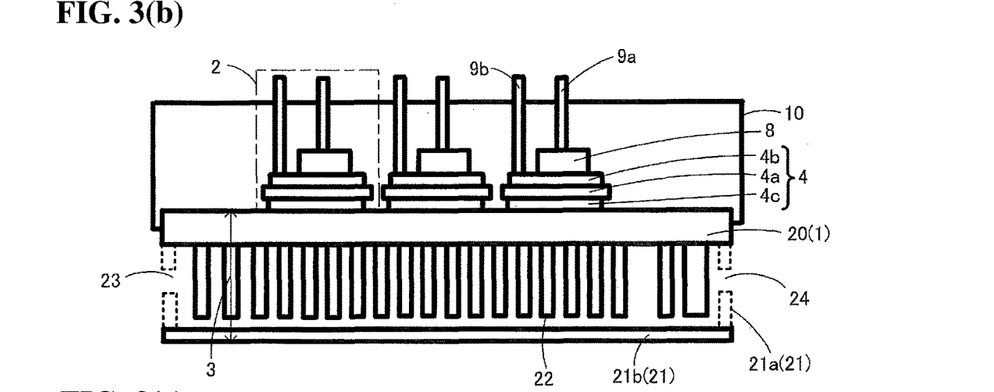
Figure 3C:
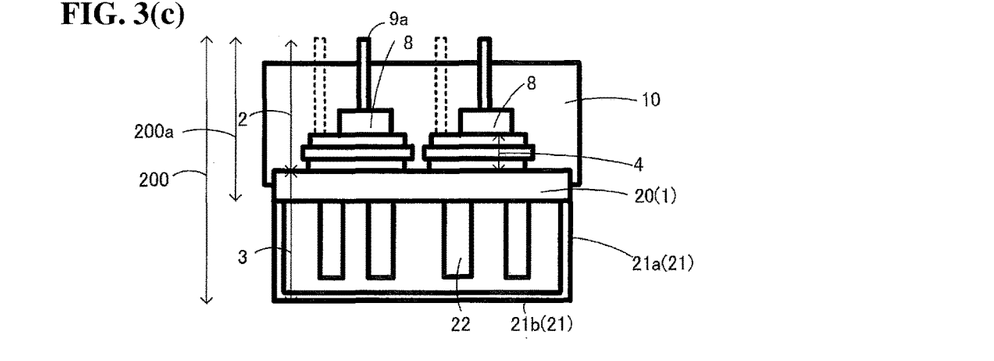

FIG. 3 is a diagram of a semiconductor device 200 of Working Example 2 according to the invention. FIG. 3(a) is a main portion plan view, viewed through a bottom plate 21b of a cooler 3, FIG. 3(b) is a main portion sectional side view taken along the line 3(b)-3(b) in FIG. 3(a), and FIG. 3(c) is a main portion sectional side view taken along the line 3(c)-3(c) in FIG. 3(a).

The semiconductor device 200 having the cooler 3 includes a plurality of intermediate assemblies 2, a cooler 3, and a resin portion 10 sealing the intermediate assemblies 2 and the upper surface of a top plate 20 of the cooler 3.

Each of the intermediate assemblies 2 includes an insulating substrate 4a, a circuit portion 4b on the upper surface of the insulating substrate, a circuit substrate 4 having a metal portion 4c on the lower surface of the insulating substrate 4a, a semiconductor chip 8, electrically connected to the circuit portion 4b, which is cooled by the cooler 3, a first external terminal 9a connected to the semiconductor chip 8, and a second external terminal 9b connected to the circuit portion 4b.

The cooler 3 includes the top plate 20, a jacket 21 having a side plate 21a and a bottom plate 21b, the side plate 21a being firmly fixed to the top plate 20, a refrigerant inflow port 23 through which a refrigerant flows into a space surrounded by the top plate 20 and jacket 21, a refrigerant outflow port 24 through which the refrigerant flows out from the space, a plurality of fins 22 firmly fixed to the top plate 20 and disposed separately on each of the left and right of a main refrigerant path in the jacket 21 to be inclined toward the inflow side of the main refrigerant path, heat transfer pins 25 disposed in positions on the top plate 20 on the refrigerant inflow sides of the fins, and curved plate-like bimetal valves 26, one end of which is connected to each respective heat transfer pin 25, and the other end of which is a free end. The plurality of fins 22 of the cooler 3 is fixed to the rear surface of the top plate 20, and is thermally connected to the semiconductor chip 8 by way of the top plate 20, the metal portion 4c, the insulating substrate 4a, and the circuit portion 4b. The heat transfer pins 25 are disposed on the rear surface of the top plate 20 which is located below the insulating substrate 4a. The inclination angle of the fin 22 is in a range of 30 degrees or more and 60 degrees or less with the main refrigerant path as a reference.

The resin portion 10 houses the circuit substrates 4a, the semiconductor chips 8, the first external terminals 9a, and the second external terminals 9b, except the surfaces on the opposite side of the metal portions 4c from the insulating substrates 4a, each one end of the first external terminals 9a, and each one end of the second external terminals 9b.

The top plate 20 of the cooler of FIGS. 3(a)-3(c) is an intermediate member to which the metal portions 4c on the rear surfaces of the insulating substrates 4a are firmly fixed by a joining material, such as a solder, and which serves as the metal base 1. For example, the intermediate assemblies 2 each have a configuration wherein for example, an IGBT chip and an FWD chip are connected in inverse parallel to the circuit substrate 4, and the first external terminal 9a and the second external terminal 9b are disposed on the circuit substrate 4, and the intermediate assemblies 2 are firmly fixed to the top plate 20 (the metal base 1), and subsequently, are covered with the resin portion 10, thus completing the semiconductor module 200a. One intermediate assembly 2 can form one arm of an inverter circuit. Therefore, a three-phase inverter circuit can be formed by using six intermediate assemblies 2.

The semiconductor device 200 is shown as a mold resin type, but is not limited to this. There is also a case in which the semiconductor device 200 is, for example, of a terminal case type wherein the intermediate assemblies 2 are housed in a terminal case in which external lead-out terminals are insert molded.

The difference between the cooler portion shown by numeral 3 shown in FIGS. 3(a)-3(c) and the cooler 100b shown in FIGS. 1(a)-1(c) is in that the metal base 1, to which the intermediate assemblies 2 are firmly fixed, serves as the top plate 20 of the cooler 3. As described in FIGS. 1(a)-1(c), by installing the bimetal valves 26 on the fins 22 and adjusting the cooling capacity, it is possible to prevent a rise in temperature of the semiconductor chips 8 and equalize the temperature distribution of the whole of the semiconductor device 200.

Also, at least one bimetal valve 26 is disposed in the vicinity of the center of the insulating substrate 4a. Of course, it is preferable to dispose a plurality of bimetal valves because cooling efficiency is thereby further improved.

In this way, as the top plate 20 is removed by integrating the semiconductor module 200a and cooler 3 and causing the metal base 1 to function as the top plate 20, the heat transfer rate is improved, and it is thus possible to improve cooling efficiency. Therefore, it is possible to operate the semiconductor module 200 on the condition that the amount of heat generation is larger, thus enabling high performance (for example, an increase in current capacity).

Also, as the semiconductor device 200 has uniform temperature, a change in shape of each member due to heat expansion decreases, and it is thus possible to improve the reliability of the semiconductor 200.

The explanations about the heat transfer pins 25 and bimetal valves 26 of the cooler 100b described in FIGS. 1(a) to 2(b) also apply to the cooler 3 of FIGS. 3(a)-3(c).

Working Example 3

Figure 4:
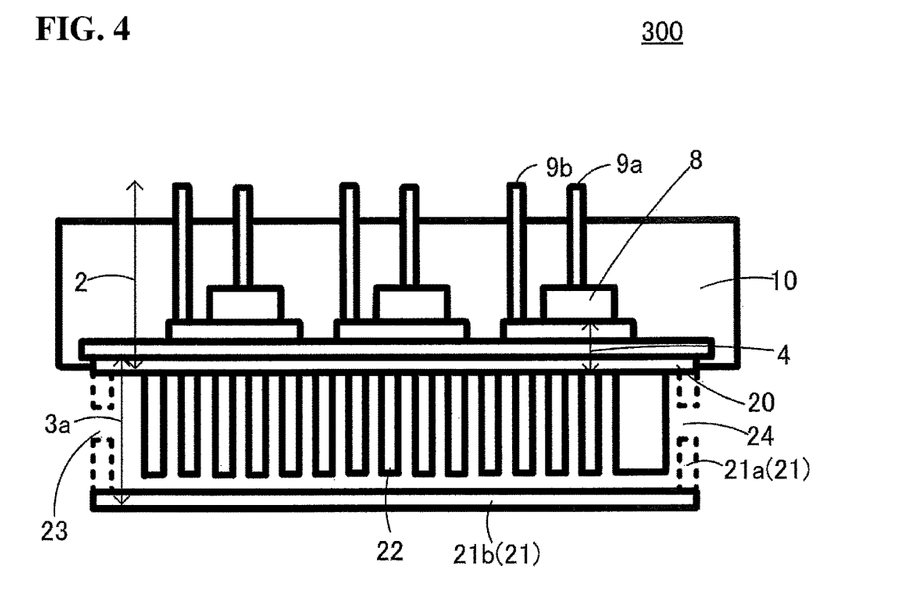
FIG. 4 is a main portion sectional view of a semiconductor device of a third working example according to the invention.

FIG. 4 is a main portion sectional view of a semiconductor device 300 of Working Example 3 according to the invention. The difference from the semiconductor device 200 of FIGS. 3(*a*)-3(*c*) is that the metal base 1 is removed and that the metal portion 4*c* on the rear surface of an insulating substrate 4 is directly utilized as a top plate 20 of a cooler 3*a*. As there is no metal base 1 or metal portion 4*c*, it is possible to improve the heat transfer rate, and thus possible to increase the cooling effect on semiconductor chips 8. Also, it is possible to miniaturize the semiconductor device 300. In the semiconductor device 300, the top plate 20, which corresponds to the metal portion 4*c*, on the rear surface of the insulating substrate 4 is common to intermediate assemblies 2.

According to Working Example 2 and Working Example 3, by providing the heat transfer pins 25 and bimetal valves 26 in the cooler 3 and integrating the cooler 3 and intermediate assemblies 2, it is possible to provide the semiconductor device 200, 300 which can be easily assembled and is improved in cooling performance.

REFERENCE SIGNS LIST

1, 51 metal base
2, 52 intermediate assembly
3, 3*a*, 100*b*, 500*b* cooler
4, 54 circuit substrate
4*a*, 54*a* insulating substrate
4*b*, 54*b* circuit portion
4*c*, 54*c* metal portion
8, 58 semiconductor chip
9*a*, 59*a* first external terminal
9*b*, 59*b* second external terminal
22*a* leading end portion
10, 60 resin portion
20, 70 top plate
21, 71 jacket
21*a*, 71*a* side plate
21*b*, 71*b* bottom plate
22, 72 fin
23, 73 refrigerant inflow port
24, 74 refrigerant outflow port
25 heat transfer pin
26 bimetal valve
26*a* free end
28, 78 thermal compound
30 main refrigerant path
30*a* central axis
34 blocking plate
80 stream
81 place
100*a*, 200*a*, 500*a* semiconductor module
100, 200, 300, 500 semiconductor device
P1, Q1, Q2, T minimum distance
θ inclination angle
L length of bimetal valve

What is claimed is:

1. A cooler for cooling a semiconductor module, comprising:
    a top plate;
    a jacket having a bottom plate, a side plate firmly fixed to the top plate, and a main refrigerant path therein;
    a refrigerant inflow port through which a refrigerant flows into a space surrounded by the top plate and jacket;
    a refrigerant outflow port through which the refrigerant flows out from the space;
    a plurality of fins firmly fixed to the top plate, disposed separately on each of the left and the right relative to the main refrigerant path in the jacket and disposed to incline toward an inflow side of the main refrigerant path;
    heat transfer pins disposed on the top plate on the refrigerant inflow side of the fins; and
    a curved plate-like bimetal valve having one end connected to each heat transfer pin, and another free end.

2. The cooler according to claim 1, wherein an inclination angle of the fins is in a range of 30 degrees or more and 60 degrees or less with respect to the main refrigerant path as a reference.

3. The cooler according to claim 1, wherein the refrigerant is a liquid.

4. The cooler according to claim 3, further comprising a blocking plate on a downstream side of the main refrigerant path in front of the refrigerant outflow port.

5. The cooler according to claim 3, wherein an installation distance between adjacent heat transfer pins is twice or more as large as a distance between adjacent fins.

6. The cooler according to claim 3, wherein the bimetal valve has a structure such that the bimetal valve changes to a first shape, which is curved in a refrigerant inflow direction, and to a second shape which becomes closer to linear as a temperature becomes higher than that in the first shape, and in the first shape, a distance between the free end of the bimetal valve and the fin adjacent thereto is equal to a distance between adjacent fins.

7. The cooler according to claim 6, wherein the bimetal valve includes a first metal piece, and a second metal piece joined together, the second metal piece having expansion coefficient higher than that of the first metal piece, the first metal piece is an iron-nickel alloy plate, and the second metal piece is formed of one or a plurality of metals selected from the group consisting of manganese, chromium, and copper, added to an iron-nickel alloy plate.

8. The cooler according to claim 7, wherein a thickness of the bimetal valve is 0.5 mm or more and 5 mm or less.

9. A semiconductor device comprising:
    a cooler for cooling a semiconductor module, comprising:
        a top plate;
        a jacket having a bottom plate, a side plate firmly fixed to the top plate, and a main refrigerant path therein;
        a refrigerant inflow port through which a refrigerant flows into a space surrounded by the top plate and jacket;
        a refrigerant outflow port through which the refrigerant flows out from the space;
        a plurality of fins firmly fixed to the top plate, disposed separately on each of the left and each of the right relative to the main refrigerant path in the jacket and disposed to incline toward an inflow side of the main refrigerant path;
        heat transfer pins disposed on the to plate on the refrigerant inflow side of the fins; and
        a curved plate-like bimetal valve having one end connected to each heat transfer pin, and another free end;
    a circuit substrate having an insulating substrate, a circuit portion on an upper surface of the insulating substrate, and a metal portion on a lower surface of the insulating substrate;
    a semiconductor chip electrically connected to the circuit portion, which is cooled by the cooler;
    a first external terminal connected to the semiconductor chip;
    a second external terminal connected to the circuit portion; and a resin portion which houses the circuit substrate, the semiconductor chip, the first external terminal, and the second external terminal, except a surface on an opposite side of the metal portion from the insulating substrate, one end of the first external terminal, and one end of the second external terminal, wherein the plurality of fins is thermally connected to the metal portion, and the heat transfer pins are disposed below the insulating substrate.

10. The semiconductor device according to claim 9, further comprising:
   a plurality of intermediate assemblies, each having the circuit substrate, the semiconductor chip, the first external terminal, and the second external terminal;
   a metal base disposed between a plurality of metal portions and the top plate;
   a first connection member which thermally connects the plurality of metal portions and the metal base; and
   a second connection member which thermally connects the metal base and top plate.

11. The semiconductor device according to claim 9, wherein the top plate is the metal portion.

* * * * *

UNITED STATES PATENT AND TRADEMARK OFFICE
CERTIFICATE OF CORRECTION

| | |
|---|---|
| PATENT NO. | : 9,653,379 B2 |
| APPLICATION NO. | : 15/066382 |
| DATED | : May 16, 2017 |
| INVENTOR(S) | : Takahiro Koyama et al. |

It is certified that error appears in the above-identified patent and that said Letters Patent is hereby corrected as shown below:

On the Title Page

Page 2, Column 2, item (56) FOREIGN PATENT DOCUMENTS:
Please add --JP 2002-502135 A 1/2002--

Signed and Sealed this
Twenty-ninth Day of August, 2017

Joseph Matal
*Performing the Functions and Duties of the*
*Under Secretary of Commerce for Intellectual Property and*
*Director of the United States Patent and Trademark Office*